(12) United States Patent
Markovich et al.

(10) Patent No.: US 8,536,459 B2
(45) Date of Patent: *Sep. 17, 2013

(54) CORELESS LAYER BUILDUP STRUCTURE WITH LGA

(75) Inventors: Voya Markovich, Endwell, NY (US);
Timothy Antesberger, Vestal, NY (US);
Frank D. Egitto, Binghamton, NY (US);
William Wilson, Waverly, NY (US);
Rabindra N. Das, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 1 day.

This patent is subject to a terminal disclaimer.

(21) Appl. No.: 12/764,994

(22) Filed: Apr. 22, 2010

(65) Prior Publication Data

US 2012/0160544 A1 Jun. 28, 2012

(51) Int. Cl.
*H05K 1/03* (2006.01)
*H05K 1/02* (2006.01)
*H05K 1/09* (2006.01)

(52) U.S. Cl.
USPC ........... 174/255; 174/251; 174/257; 174/262; 361/748

(58) Field of Classification Search
USPC ................ 174/251, 262; 29/852; 361/748, 361/255, 257, 258
See application file for complete search history.

(56) References Cited

U.S. PATENT DOCUMENTS

| | | | |
|---|---|---|---|
| 5,542,174 A * | 8/1996 | Chiu | 29/840 |
| 5,869,880 A * | 2/1999 | Grill et al. | 257/522 |
| 6,274,391 B1 * | 8/2001 | Wachtler et al. | 438/6 |
| 6,284,982 B1 * | 9/2001 | Kusner et al. | 174/255 |
| 6,465,084 B1 | 10/2002 | Curcio et al. | |
| 6,562,657 B1 * | 5/2003 | Lin | 438/113 |
| 6,638,607 B1 | 10/2003 | Curcio et al. | |
| 6,879,492 B2 * | 4/2005 | Alcoe et al. | 361/748 |
| 6,969,436 B2 | 11/2005 | Curcio et al. | |
| 7,050,304 B2 * | 5/2006 | Hsu et al. | 361/719 |
| 7,239,525 B2 * | 7/2007 | Hsu | 361/763 |
| 7,242,092 B2 * | 7/2007 | Hsu | 257/723 |
| 7,303,639 B2 | 12/2007 | Curcio et al. | |
| 7,539,022 B2 * | 5/2009 | Hsu | 361/763 |
| 7,592,706 B2 * | 9/2009 | Hsu | 257/777 |
| 7,656,040 B2 * | 2/2010 | Hsu et al. | 257/777 |
| 2002/0189853 A1 * | 12/2002 | Hsu | 174/252 |
| 2006/0043549 A1 * | 3/2006 | Hsu | 257/678 |
| 2006/0060557 A1 * | 3/2006 | Sreenivasan et al. | 216/11 |
| 2007/0007033 A1 * | 1/2007 | Das et al. | 174/257 |
| 2007/0045784 A1 * | 3/2007 | Corisis et al. | 257/666 |
| 2007/0243387 A1 * | 10/2007 | Lin et al. | 428/420 |
| 2007/0246744 A1 * | 10/2007 | Chen et al. | 257/211 |
| 2008/0185704 A1 * | 8/2008 | Hsu et al. | 257/690 |

FOREIGN PATENT DOCUMENTS

| | | | |
|---|---|---|---|
| JP | 2005064498 A | * | 3/2005 |
| JP | 2007214534 A | * | 8/2007 |

* cited by examiner

*Primary Examiner* — Anatoly Vortman
(74) *Attorney, Agent, or Firm* — Bond Schoeneck & King, PLLC

(57) ABSTRACT

A substrate for use in a PCB or PWB board having a coreless buildup layer and at least one metal and at least one dielectric layer. The coreless buildup dielectric layers can consist of at least partially cured thermoset resin and thermoplastic resin. The substrate may also contain land grid array (LGA) packaging.

18 Claims, 6 Drawing Sheets

CORELESS LAYER BUILDUP STRUCTURE WITH LGA

RELATED APPLICATIONS

The present application is related to co-pending U.S. patent application Ser. No. 12/764,993 for CORELESS LAYER BUILDUP STRUCTURE and co-pending U.S. patent application Ser. No. 12/764,997 for CORELESS LAYER BUILDUP STRUCTURE WITH LGA AND JOINING LAYER, both incorporated by reference herein in their entirety.

FIELD OF THE INVENTION

The present invention relates to circuit board manufacturing and preparation and, more specifically, to a structure wherein a core is built up utilizing at least partially to completely advanced thermoset resin or thermoplastics.

BACKGROUND OF THE INVENTION

A common procedure in circuit board processing involves laminating multiple cores together. However, generally, the cores are not electrically connected via to via during lamination. For example, one method involves first electrically connecting the cores using conductive pads. After lamination, a hole is drilled through the conductive pads and electroplated with copper to form the via.

An alternative solution uses conductive adhesive to electrically attach vias during lamination. The conductive adhesive is placed onto a via and electrically connects the vias when the cores are laminated together. However, conductive adhesives contain plate-like structures greater than 0.5 mils in size. These plates tend to clog at the top of the holes. Therefore, the adhesives cannot be used effectively with thicker cores and smaller vias. Additionally, conductive adhesives require precious metal for good connections, making the products more expensive. Finally, a substantial number of manufacturing sites are not equipped to handle conductive adhesives. Consequently, significant costs may be required to modify current manufacturing sites to use conductive adhesives.

As a result, there exists a need for a structure and method of attaching cores having vias with conductive surfaces without using a conductive material for the joining process such as that that is currently used.

DISCUSSION OF RELATED ART

U.S. Pat. No. 6,465,084, by Curcio, et al., granted Oct. 15, 2002, and U.S. Pat. No. 6,638,607, by Curcio, et al., granted Oct. 28, 2003 for METHOD AND STRUCTURE FOR PRODUCING Z-AXIS INTERCONNECTION ASSEMBLY OF PRINTED WIRING BOARD ELEMENTS disclose a method of forming a core for a composite wiring board. The core has an electrically conductive coating on at least one face of a dielectric substrate. At least one opening is formed through the substrate extending from one face to the other and through each conductive coating. An electrically conductive material is dispensed in each of the openings extending through the conducting coating. At least a portion of the surface of the conductive coating on one face is removed to allow a nub of the conductive material to extend above the substrate face and any remaining conductive material to thereby form a core that can be electrically joined face-to-face with a second core member or other circuitized structure.

U.S. Pat. No. 6,969,436 by Curcio, et al., granted Nov. 29, 2005 for METHOD AND STRUCTURE FOR PRODUCING Z-AXIS INTERCONNECTION ASSEMBLY OF PRINTED WIRING BOARD ELEMENTS and U.S. Pat. No. 7,303,639, by Curcio, et al., granted Dec. 4, 2007 for METHOD FOR PRODUCING Z-AXIS INTERCONNECTION ASSEMBLY OF PRINTED WIRING BOARD ELEMENTS disclose a method of forming a member to form a composite wiring board. The member includes a dielectric substrate. Adhesive tape is applied to at least one face of said substrate. At least one opening is formed through the substrate extending from one face to the other and through each adhesive tape. An electrically conductive material is dispensed in each of the openings and partially cured. The adhesive tape is removed to allow a nub of the conductive material to extend above the substrate face to form a wiring structure with other elements.

SUMMARY OF THE INVENTION

According to the present invention, there is provided a method and structure of attaching a plurality of cores. A substrate for use in a PC board has a coreless buildup layer and a metal layer and LGA disposed thereon. Optionally, a second metal layer can be provided with a dielectric layer between the two metal layers.

A first aspect of the invention is directed to having coreless buildup layers consisting of thermoset resin. Each or alternate buildup layers are partially advanced to process circuitization and subsequently fully cured during final lamination process. Example of buildup layers: resin coated Cu based on filled epoxy or filled PPE, etc.

A second aspect of the invention is directed to a method having coreless buildup layers consisting of thermoplastics. Each buildup layer is circuitized and subsequently laminated to get final structure. Example of buildup layers: Polyimide, liquid crystal polymer (LCP) or Teflon® based materials. Buildup layers can also be a mixture of thermoplastics such as LCP and polyimide. Here, LCP will melt and form bonding among the buildups. For LCP and Teflon mixtures, LCP will likewise melt and form bonding among the buildups.

A third aspect of the invention is directed to a structure having coreless buildup layers consisting of thermoset and/or thermoplastic resin. Here the thermoset buildup layers are partially advanced to process circuitization and subsequently fully cured during a final lamination process.

A fourth aspect of the invention is directed to a method having coreless buildup layers consist of thermoset and/or thermoplastic resin. Here thermoset buildup layers are fully cured and circuitized. Thermoplastic will melt and form bonding among the buildups.

A fifth aspect of the invention is directed to a method having a metal surface: It can be metal or alloy or their mixture that will diffuse with each other during final bonding. All surfaces, some surfaces, or alternate surface can have low melting point metal or alloy surface finish where low melting melts during or after lamination and form metal-metal bonding.

Another aspect of the invention is directed to a structure that consists of at least one joining layer, wherein joining layers will connect multiple signal layers. Joining multiple signal layers and land grid array (LGA) can be a single step or a multi step process.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
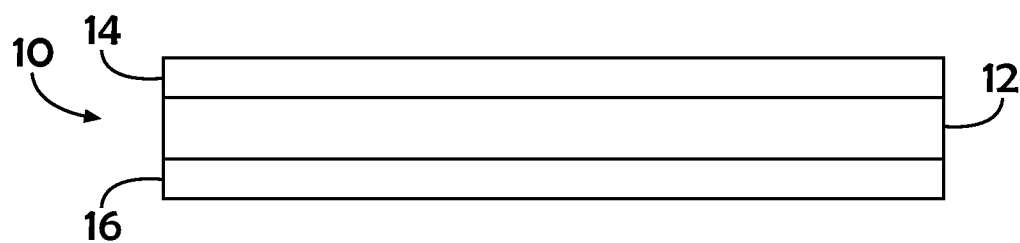
FIGS. 1-6 show a longitudinal, sectional view, somewhat diagrammatic, of the steps to form a core member according to one embodiment of the present invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements between the drawings.

For the sake of clarity and brevity, like elements and components of each embodiment will bear the same designations throughout the description.

DESCRIPTION OF THE PREFERRED EMBODIMENT

In the invention, a method and structure are provided for electrically joining a plurality of cores using thermoset resin and/or thermoplastic.

Referring now to the drawings and, for the present, to FIGS. 1-6, the successive steps in forming a core member 10 for use in laminating to another core member to form a printed wiring board according to one embodiment of the invention are shown. As can be seen in FIG. 1, the core member 10 includes a dielectric substrate 12 which has layers of metal coatings 14 and 16 on opposite faces thereof. Dielectric substrate 12 can be any conventional dielectric, such as FR4 (a glass reinforced epoxy), polyimide, polytetrafluoroethylene or other suitable well known dielectric. In the embodiment shown in FIGS. 1-6, the metal coatings 14 and 16 preferably are copper and, typically, the layer is either one-half ounce copper (17.5 µm), one ounce copper (35 µm thick) or two ounce copper (70 µm thick). However, other thicknesses of copper coatings can be used.

Figure 2:
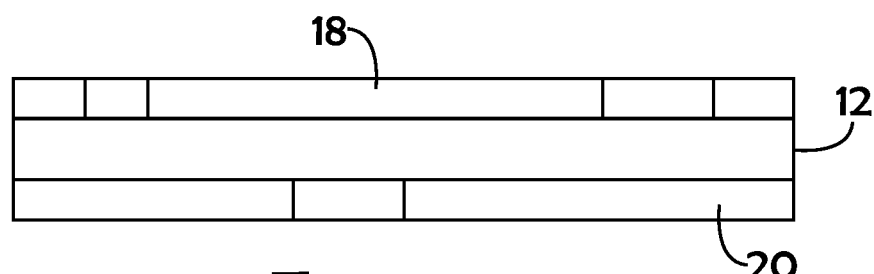

As shown in FIG. 2, preferably the copper layer 14 is patterned to form circuit traces 18 and the copper layer 16 is patterned to form circuit traces 20. Any conventional patterning process, such as by using a photoresist, exposing, developing and etching the exposed areas and then stripping the photoresist can be used.

Figure 3:
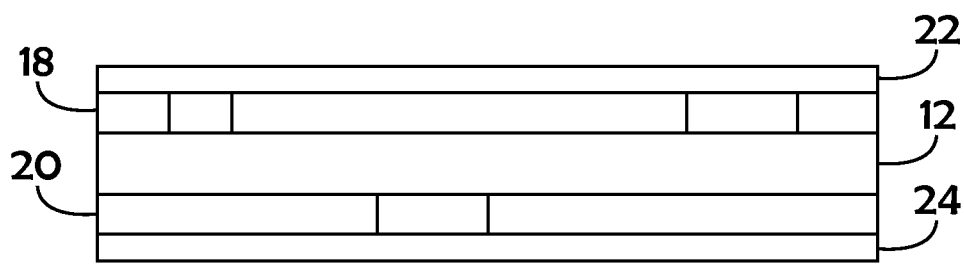

As shown in FIG. 3, a film in the form of adhesive tape 22 is applied over the circuit traces 18 and the same type of film is applied over the circuit traces 20. A particularly useful adhesive tape is a polyimide having a silicone adhesive. This is available from Dielectric Polymers, Inc. of Holyoke, Mass. This tape must be compatible with the conductive material and processes associated with the formatting of the core, which will be described presently. Other types of film material may be used, such as plating tapes NT-580, 582, 583, 590 and 590-2 manufactured by Dielectric Polymers, Inc. The tape 22 and 24 should be of a thickness equal to the height that it is desired to have the conductive material extend above the circuit traces 18 and 20. If a single layer of tape is not sufficient, multiple layers may be used.

Figure 4:
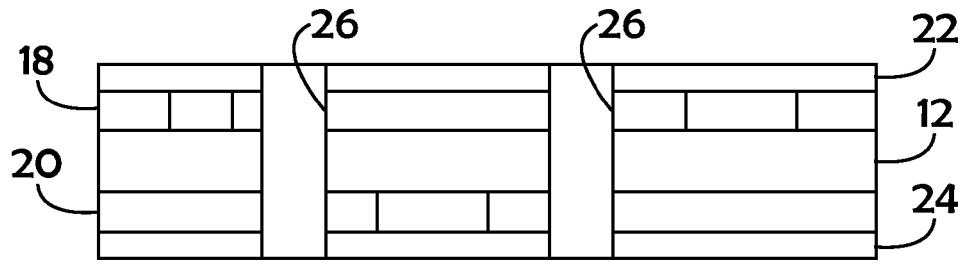

Referring now to FIG. 4, a plurality of holes or openings, two of which are shown at 26, are drilled through the entire composite, including the adhesive tape 22 and 24, circuit traces 18 and 20 and the substrate 12. These holes or openings 26 define the location of the conductive interconnect vias that will be formed.

Figure 5:
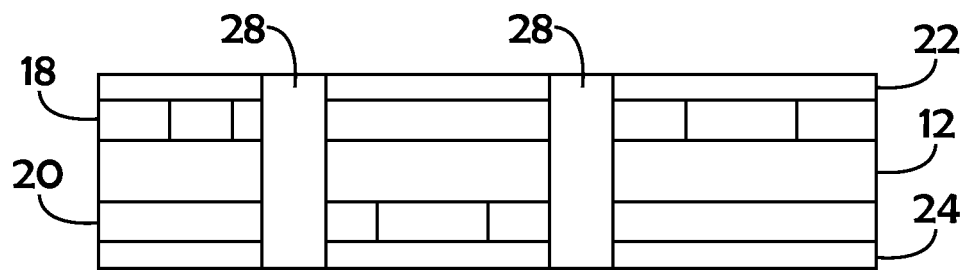

Into the openings 26 is deposited an electrically conductive paste material 28, as shown in FIG. 5. The filling of these openings 26 can be performed by screening, stenciling, flood coating, doctor blading, immersing or injecting. Various types of conductive material may be used. By the term "conductive paste" as used herein is meant an electrically conductive paste composition adapted for use in holes or openings of substrates as well as between conductors which form parts of conductive planes of such a substrate. Such a paste includes at least one organic binder component and, in one embodiment, at least one metallic component including a plurality of "microparticles." In another embodiment, the paste includes such an organic binder in addition to the aforementioned microparticles. A preferred conductive polymer material is a conductive epoxy sold by National Starch and Chemical Company under the trademark "Ablebond 8175" (This was formerly sold by Ablestik Corporation). "Ablebond 8175" is a silver filled thermosetting epoxy. Following the filling of the holes 26, as shown in FIG. 5, the epoxy is B-staged which entails heating the material to a temperature of about 130° C. until the degree of cure is advanced from about 20% to about 80% complete cure. As will become apparent later, the film material should not be fully cured at this stage since it will be used to adhere to another conductive epoxy in another core element. Alternatively, a solder paste of tin lead, tin lead silver, tin silver copper, tin silver copper antimony or tin bismuth, which are commercially available, can be used and heated to reflow.

Figure 6:
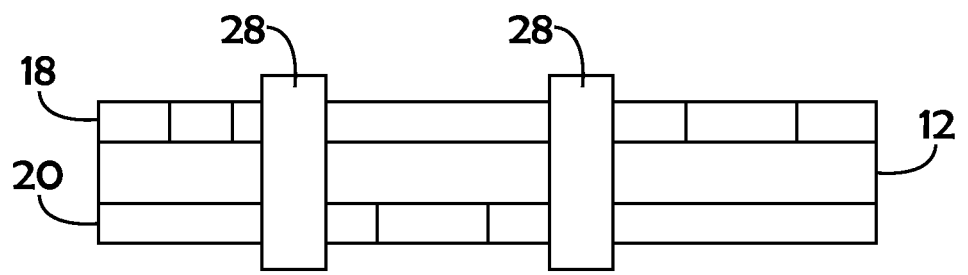

After the conductive material 28 is partially cured, the adhesive tape 22 and 24 is removed to provide the structure shown in FIG. 6. As can be seen in FIG. 6, the partially cured conductive material 28 extends above the circuit traces 18 and 20 a distance equal to the thickness of the adhesive tape 22 and 24.

If the copper layers 14 and 16 have not been previously patterned, that can be done at this point. However, in general, it is preferred that the patterning to form the circuit traces 18 and 20 be done, as shown in FIG. 2, at that stage in the process so that the conductive material 28 is not subjected to the harsh chemical processes normally encountered in patterning material.

Figure 7:
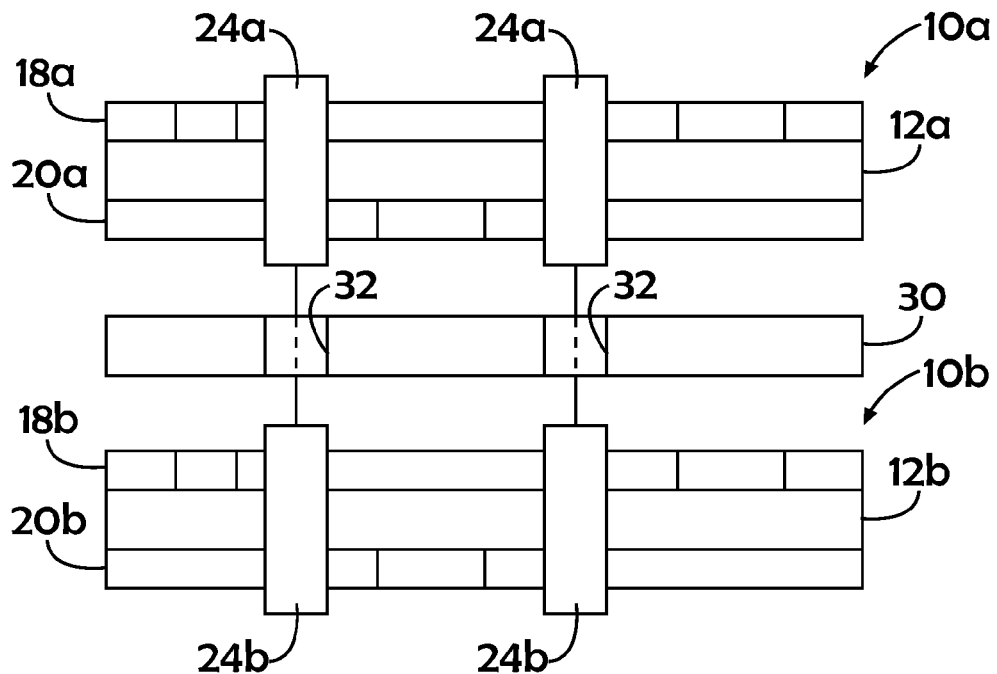
FIGS. 7 and 8 show the steps of laminating two core members together to form a printed wiring board according to one embodiment of the invention.

As can be seen in FIG. 7, two core elements 10a and 10b are provided which are to be laminated together. It will be noted that the two core elements 10a and 10b are very similar except that the circuit traces on each of them is slightly different. (In describing the embodiments of FIGS. 7 and 8, the letter suffixes a and b are used to denote similar structures in each core element.) As seen in FIG. 7, a pre-drilled adhesive bonding film 30, such as the film sold under the trademark Pyralux LF by Pyralux Corporation, is interposed between the two cores 10a and 10b. The film 30 has openings 32 drilled therein which are positioned to align with the conductive fill material 28a, 28b in the two core elements 10a and 10b.

Figure 8:
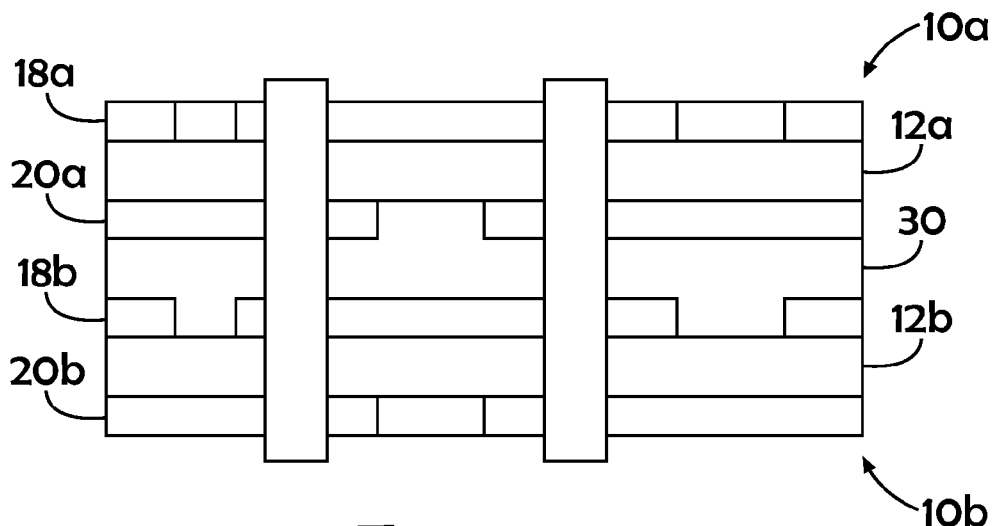
Figure 9:
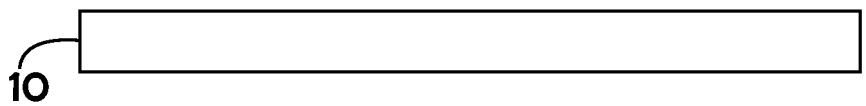
FIGS. 9-13 show a longitudinal, sectional view, somewhat diagrammatic, of the steps to form a joining member according to another embodiment of the present invention.
Figure 10:
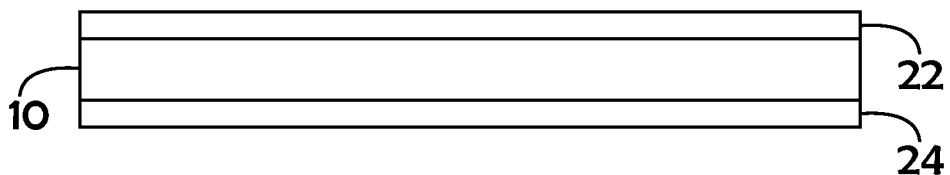

Heat and pressure are applied to cause the two core members to bond together, with the Pyralux LF film acting as an adhesive bond material. Also, the fill material 28a and 28b in each of the openings in the two core members 10a and 10b will bond together, as shown in FIG. 8, to form a continuous Z-axis electrical connection between the circuit traces 18a, 18b, 20a and 20b on the core element 10a and 10b. Also, the material of the substrate 30 will fill around the circuit traces 18b and 20a. The lamination process also advances the cure of the conductive fill material 28a and 28b past 80% to the fully cured stage. A specially formulated dicing tape can be used as adhesive tape 22. An example of suitable dicing tape is Adwill D-series tape provided by Lintec Corporation. These tapes are comprised of a base material, such as PVC (poly vinyl chloride), or PET (polyethylene terephthalate), or PO (polyolefin) with an adhesive film that provides strong temporary adhesion. Alternatively, the adhesive could be provided on other base material, such as polyimide.

The adhesive layer provided on the base layer is formulated so that it provides strong initial adhesion but, upon exposure to UV (ultraviolet) radiation, its adhesion is diminished and it can be peeled and released without causing damage or leaving residue on the copper traces 18 or the dielectric layer 12. In such case, the backing must be transparent to UV radiation. Also, it is to be understood that the tape 22, 24 does not need to be a dielectric. For example, a metal foil with an adhesive on one side could be used. This also constitutes a "tape". (Alternatively, the film material 30 could be a dry film epoxy adhesive which is B-staged, or thermoplastic LCP film or organic pre-preg typically comprising a layer of glass (typically fiberglass) cloth impregnated with a partially cured material, typically a B-staged epoxy resin or other film type adhesive dielectric layers and used to laminate the core elements 10a and 10b together.)

Referring now to FIGS. 9-13, another embodiment of the present invention is shown which is useful in forming a joining member. A substrate 10 is provided which is preferably an adhesive dielectric material. For example, this could be an adhesive coated film (such as duPont Pyralux LF, which is a modified acrylic adhesive on a polyimide film) or a B-staged thermoset adhesive (such as IBM Dri-clad glass reinforced high glass transition dielectric material), or other film type adhesive dielectric layers, including materials such as Rogers 2800 Silica filled polytetrafluoroethylene. Thermoset resin coated Silica filled polytetrafluoroethylene or thermoset resin coated liquid crystal polymer (LCP) or LCP-Silica filled polytetrafluoroethylene-LCP or LCP-Polyimide-LCP type materials can also be used. In general, LCP bondply (available from Rogers) can be laminated with polyimide or Silica filled polytetrafluoroethylene to make LCP-Polyimide-LCP or LCP-Silica filled polytetrafluoroethylene-LCP mixed dielectric.

Figure 11:
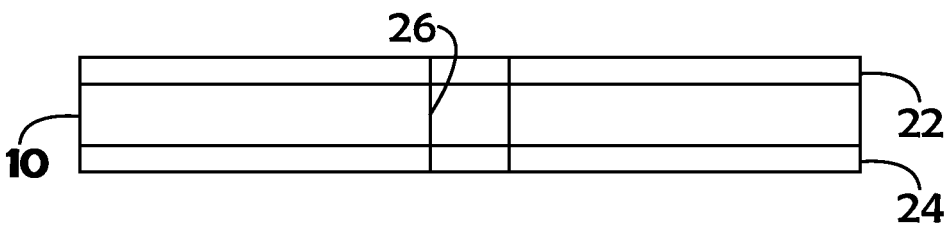
Figure 13:
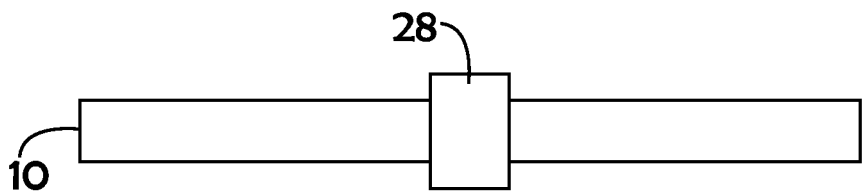

A plurality of holes, one of which is shown at 26, is either mechanically or laser drilled through the substrate 12 and through both of the tapes 22 and 24, as shown in FIG. 11. A conductive material 28 of the same type as described with respect to FIGS. 1-6 is deposited in the hole 26 by the same techniques as previously described with respect to FIGS. 1-6. After the conductive material 28 is remelted or cured, as previously described, the adhesive tapes 22 and 24 are removed to provide a joining member, as shown in FIG. 13. Alternatively, tapes 22 and 24 can be CU layer. Cu can be removed by an etching process. Proper conducting paste such as silver-epoxy based paste is etch resistant and generates paste nubs (FIG. 13).

Figure 12:
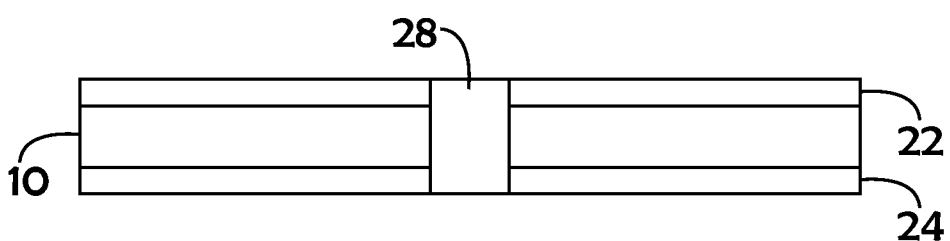

In FIG. 11a, the opening 26 is plated, preferably with copper, to form inner conductive layers. A preferred method of accomplishing this is to use a "flash" plating of electroless copper. It is to be understood that forming plated layers 35 is an optional step in forming a substrate as defined herein, but is preferred to further assure sound conductive paths in these portions of the structure. The next step, as also shown in FIG. 12, involves the deposition of conductive paste 28 within each of the plated openings 26. Such deposition may be accomplished using conventional paste printing processes or dispensing through conventional needles. Significantly, the conductive paste as used in this embodiment includes a binder (preferably an organic binder) component and at least one metallic component. As defined herein, this metallic component is in the form of microparticles or nanoparticles or their mixtures, either as flakes or semi-colloidal powders. Metals may include copper, silver, gold, zinc, cadmium, palladium, iridium, ruthenium, osmium, rhodium, platinum, iron, cobalt, nickel, indium, tin, antimony, lead, bismuth and alloys thereof for the microparticles.

In one embodiment of the invention, a conductive paste having silver microparticles may be used, the paste including an anhydride epoxide as the organic binder. This paste preferably includes about 88% by weight of the silver microparticles and about 12% by weight of the anhydride epoxide. With the solder added to the microparticles as described below, the resulting paste has a decomposition temperature of approximately 340 degrees C., which, when considering the above high temperature dielectric material, is about ten degrees C. less than the 350 degrees C. temperature the dielectric can withstand during lamination. The average silver particles are each from about 0.01 microns to about 10 microns in diameter. In the case of both flat particles (flakes) and rod-like particles, thicknesses are each from about 0.01 micron to 10 micron.

Although only one opening 26 is depicted in FIG. 11a, this is meant to be representative only. In one example, a total of 2500 openings may be provided within a rectangular layer having dimensions of about 52.5 millimeters (mm) wide by about 52.5 mm long, and a thickness of about 0.175 mm. These 2500 paste filled nubs in FIG. 13 generate 3-D micro arrays. These kinds of conductive adhesive based 3-D micro array Z-interconnects are used to connect multiple electronic layers.

FIGS. 6 and 13 show 3-D micro arrays for connecting several electronic layers starting from chip to board. Adhesives formulated using controlled-sized particles, ranging from nanometer scale to micrometer scale, were used to form micro arrays of contact pads having diameters ranging from 5 µm to 250 µm for internal and external interconnect applications. For example, micro arrays (not shown) with pads having 5-15 micron diameters are suitable for device level interconnects (chip to chip interconnects), whereas 50-75 µm and 250 µm diameters of the pads are suitable for chip carrier and board level interconnects, respectively.

Figure 14:
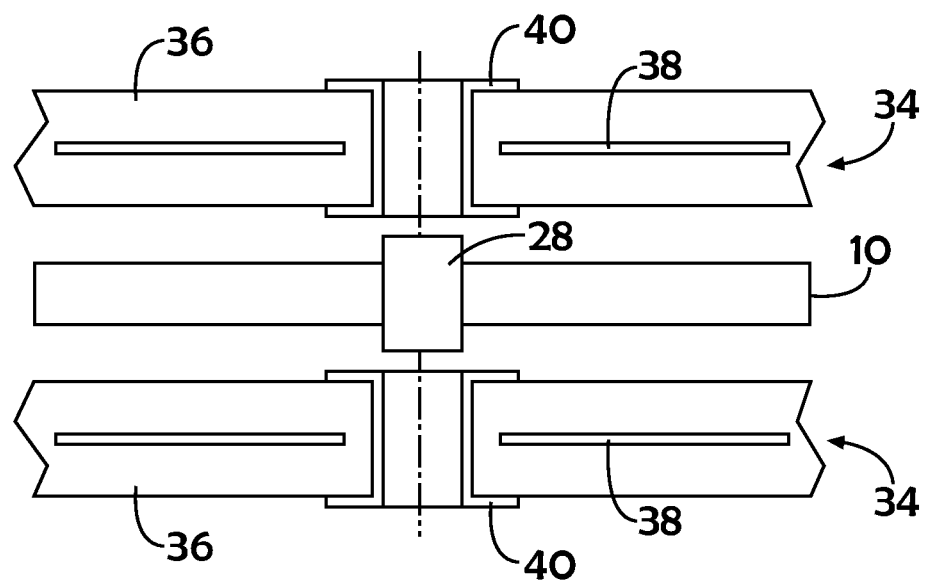
FIGS. 14 and 15 show the steps of laminating two core members together using a joining member formed according to this invention.
Figure 15:
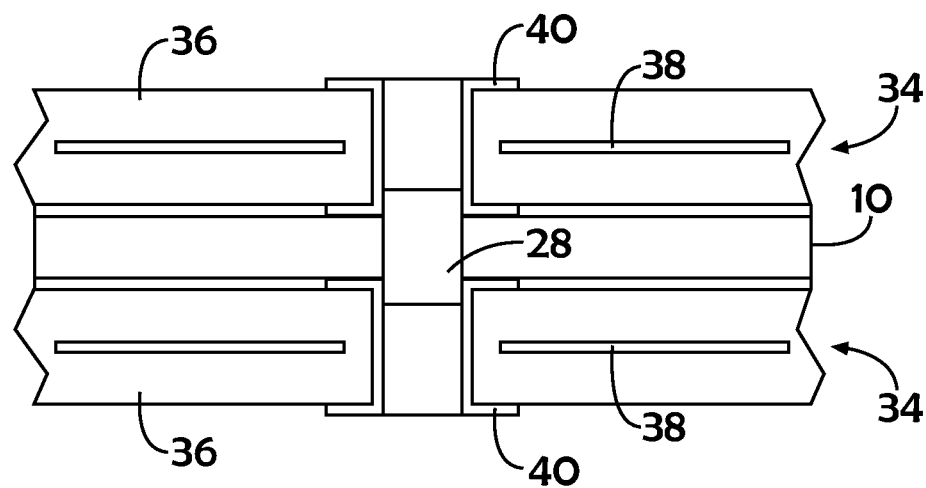

As shown in FIGS. 14 and 15, a joining member formed according to FIGS. 9-13 is used to join two printed wiring boards 34. The dielectric substrate 10 is adhesive or B-staged thermoset resin or thermoplastic polymer acting as a bonding member. Typically, the printed wiring boards will have a dielectric substrate 36 with a plurality of internal conductive planes, one of which is shown at 38, and plated through holes 40. However, this is just illustrative as the joining member can be used to join many different types of printed wiring boards, the boards shown in FIGS. 14 and 15 being merely illustrative.

Alternatively, in FIG. 14, two printed wiring boards 34 can be flexible substrates and extended beyond the joining layer 10. In that case, area 34 bonded with dielectric 10 is rigid and the rest of the area is free standing and flexible. In general, II-VI metal layers substrate made with flexible materials produces flexible substrate 34. One example of such material is sold under the product name "RO2800" dielectric material provided by Rogers Corporation, Rogers, Conn.

Again, area 34 can be a substrate having embedded capacitors and resistors. Embedded capacitors can be a high dielectric constant ceramic filled dielectric (e.g., barium titanate filled epoxy) layer. One example of such material is resin coated capacitive materials used as a buildup layer. The resistor can be a multilayer resistor foil laminated with the capacitor dielectric. For example, core can use 25 ohm per square material and 250 ohm per square inch material. This combination enables resistor ranges from 15 ohms through 30,000 ohms with efficient sizes for the embedded resistors. Here, two printed wiring boards 34 having embedded capacitors and resistors are bonded with the dielectric substrate 10. Adhesive or B-staged thermoset resin or thermoplastic polymer acts as a bonding member.

Figure 16:
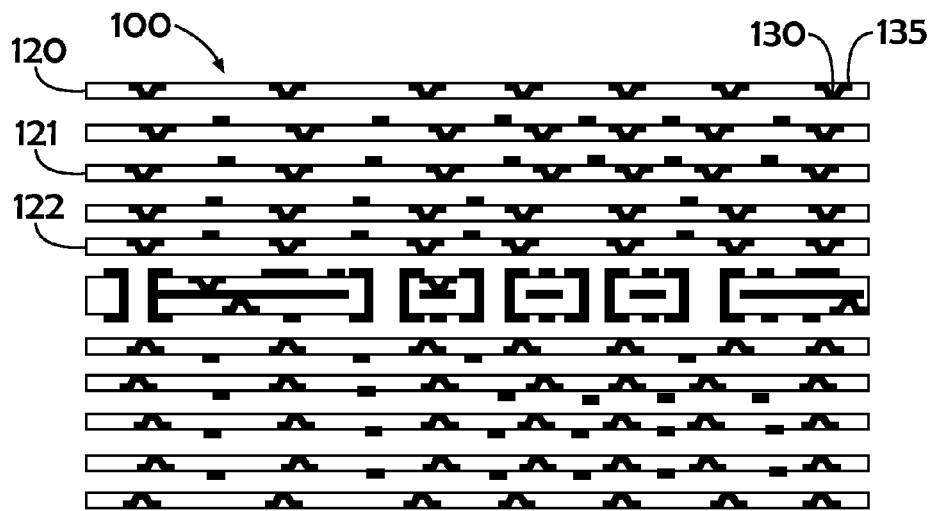
FIG. 16 shows a section view of coreless buildup layer stack up.

Referring now to FIG. 16, a core 100 is shown having a plurality of vias 130. Core 100 may comprise an epoxy core or any similar structure as commonly known in the art. Core 100 may include one or more planes 120-122, which may include, for example, a power plane, signal plane, or a ground plane. Using via 130 as an example, each via has a conductive surface 135 formed on a surface of core 100. Conductive surface 135 can comprise a thin layer of any solderable conductive material including, for example, a precious metal or copper. The joining concept for core 100 is to use compression and heating to melt or diffuse the solder to create the laminate, thereby having metallic contacts between planes 120-122 while not using a conductive paste.

Alternatively, core 100 may include multiple planes and multiple dielectric layers. At least one or multiple dielectrics can be made with thermoplastic polymers. At least one of the thermoplastic layers may be larger than the joining layer and remain as an extended flexible layer. Flexible layer can be a capacitance layer or resistor foil laminated capacitance layer. One example of such flexible capacitance material is sold under the product name "RO2800" dielectric material by Rogers Corporation, Rogers, Conn.

Figure 17:
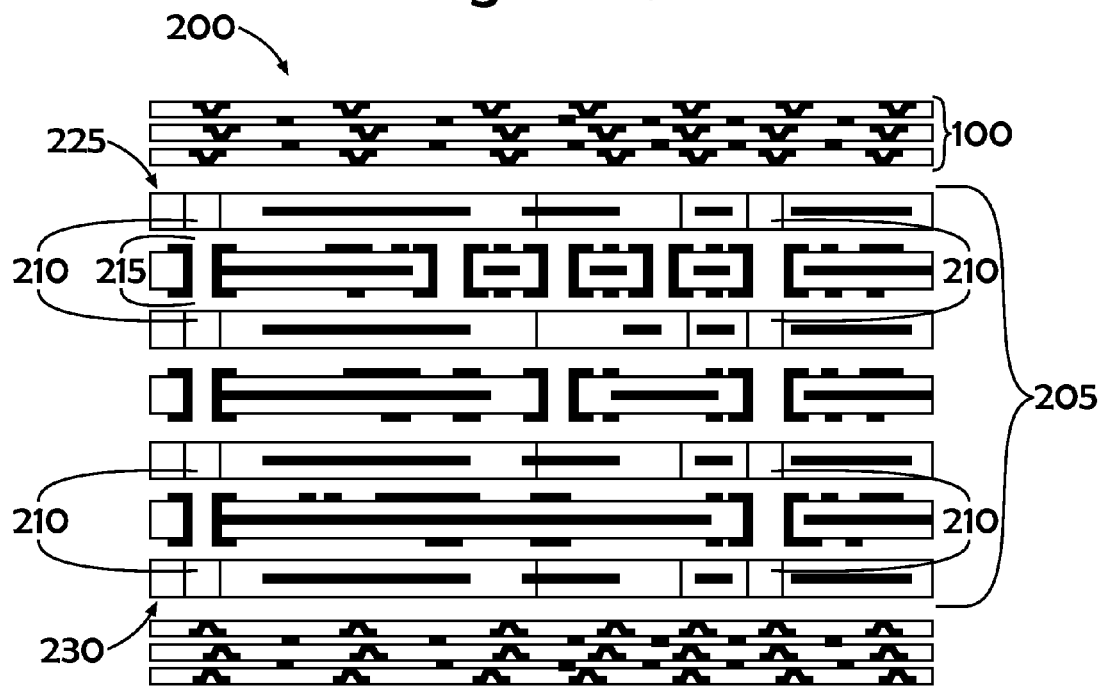
FIG. 17 shows a plurality of cores attached according to one embodiment of the current invention wherein a metallurgical paste makes an electrical connection between two Z-interconnect vias with conductive surfaces and coreless buildup layers attached thereto.

FIG. 17 shows a plurality of cores 200 attached according to one embodiment of the current invention wherein a metallurgical paste 210 creates an electrical connection between two vias with conductive surfaces 215 to create Z-axis interconnects 205 as known in the art and also the novel coreless buildup layer 100 and coreless buildup layer with LGA 105 containing individual LGA pads 220 are diffusion bonded to the upper surface 225 and lower surface 230, respectively. Few or all of the metallurgical paste 210 can be replaced by conductive adhesive to create an electrical connection between two vias with conductive surfaces 215 to create Z-axis interconnects.

Since other modifications and changes to the coreless layer buildup will be apparent to those skilled in the art, the invention is not considered limited to the description above for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A substrate for use in a PC board comprising:
   a) a flexible thermoplastic dielectric having two major surfaces;
   b) a first and a second metal layer attached to each of said major surfaces, respectively;
   c) at least two coreless, partially-filled thermoset resin-coated Cu-based buildup layers disposed respectively on said first and said second metal layers;
   d) a third and a fourth metal layer disposed on said at least two coreless buildup layers, respectively; and
   e) an electrical connection between said first and said second metal layers, and said first and said third metal layers, and said first and said fourth metal layers, and said second and said third metal layers, and said second and said fourth metal layers, and said third and said fourth metal layers;
   wherein said thermoplastic dielectric has dimensions greater than the dimensions of said coreless, partially-filled thermoset resin-coated Cu-based buildup layers, resulting in an extended flexible thermoplastic layer; and
   whereby a high density, thin substrate is produced.

2. The substrate as per claim 1, wherein said coreless buildup layer comprises a partially-cured fiberglass cloth-impregnated thermoset resin.

3. The substrate as per claim 1, wherein said coreless buildup layer comprises a thermoplastic resin.

4. The substrate as per claim 2, wherein said coreless buildup layer comprises alternate layers of partially-cured and fully-cured resin.

5. The substrate as per claim 1, further comprising:
   f) a land grid array (LGA) electrically connected to said third metal layer;
   g) a fifth metal layer; and
   h) a first joining layer of dielectric disposed between said fourth and said fifth metal layers.

6. The substrate as per claim 5, wherein said first and said second metal layers each comprise two to six metal layers.

7. The substrate as per claim 5, wherein said first joining layer of dielectric comprises at least one from the group: partially-cured thermoset resin and thermoplastic.

8. The substrate as per claim 5, wherein said first joining layer of dielectric comprises at least one from the group: high dielectric constant and low loss capacitance material.

9. The substrate as per claim 5, wherein said first and said second metal layers comprise a resistor foil laminated and circuitized on at least one from the group: at least partially-cured thermoset and thermoplastic resin dielectric layer.

10. The substrate as per claim 6, wherein said first and said second metal layers comprise a multilayer resistor foil.

11. The substrate as per claim 10, wherein said resistor foil has a resistance range of 15 ohms to 30,000 ohms.

12. The substrate as per claim 9, wherein said resistor foil comprises at least one from the group: high dielectric constant and low loss capacitance layer.

13. The substrate as per claim 5 further comprising:
   i) a sixth metal layer.

14. The substrate as per claim 13, further comprising:
   j) a second joining layer of dielectric disposed between said second and said third metal layers.

15. The substrate as per claim 14, wherein said second joining layer of dielectric comprises capacitance material.

16. The substrate as per claim 13, wherein said first and said second and said third metal layers comprise at least one plane from the group: signal, power, and ground.

17. The substrate as per claim 13, further comprising a conductive paste comprising at least one set of metal micro particles chosen from the group: copper, silver, gold, zinc, cadmium, palladium, iridium, ruthenium, osmium, rhodium, platinum, iron, cobalt, nickel, indium, tin, antimony, lead, bismuth and alloys thereof.

18. The substrate as per claim 17, wherein said conductive paste decomposition temperature is approximately 340° C.

* * * * *